(12) United States Patent
Bose et al.

(10) Patent No.: US 8,193,803 B2
(45) Date of Patent: Jun. 5, 2012

(54) CURRENT MEASURING DEVICE

(75) Inventors: Sanjay Bose, West Edison, NJ (US);
Anthony T. Giuliante, Galloway, NJ (US); Amir Makki, Northfield, NJ (US); John Walsh, New Hyde Park, NY (US); Douglas Voda, Sanford, FL (US); Timothy Franklin, Emmaus, PA (US)

(73) Assignees: Consolidated Edison Company of New York, Inc., New York, NY (US); Softstuf, Inc., Philadelphia, PA (US)

( * ) Notice: Subject to any disclaimer, the term of this patent is extended or adjusted under 35 U.S.C. 154(b) by 179 days.

(21) Appl. No.: 12/409,109

(22) Filed: Mar. 23, 2009

(65) Prior Publication Data

US 2010/0237853 A1    Sep. 23, 2010

(51) Int. Cl.
*G01R 15/20*    (2006.01)
(52) U.S. Cl. ............... 324/117 H; 324/117 R; 324/127; 336/176; 336/178
(58) Field of Classification Search ............. 324/117 H, 324/117 R, 126–127; 336/175–178
See application file for complete search history.

(56) References Cited

U.S. PATENT DOCUMENTS

| | | | | |
|---|---|---|---|---|
| 4,059,798 A * | 11/1977 | Dierker et al. | ............. | 324/127 |
| 4,704,575 A | 11/1987 | Arnoux et al. | | |
| 4,983,932 A * | 1/1991 | Kitagawa | ............. | 333/12 |
| 5,426,360 A | 6/1995 | Maraio et al. | | |
| 5,493,211 A | 2/1996 | Baker | | |
| 5,942,964 A * | 8/1999 | Takeuchi | ............. | 336/92 |
| 6,472,878 B1 * | 10/2002 | Bruchmann | ............. | 324/424 |
| 6,771,058 B2 * | 8/2004 | Lapinksi et al. | ............. | 324/117 R |
| 6,989,665 B2 | 1/2006 | Goto | | |
| 7,026,903 B2 * | 4/2006 | Hsu et al. | ............. | 336/200 |
| 7,164,263 B2 | 1/2007 | Yakymyshyn et al. | | |
| 7,327,133 B2 | 2/2008 | Baker | | |
| 2001/0052765 A1 | 12/2001 | Seike | | |
| 2003/0017753 A1 | 1/2003 | Palmisano et al. | | |
| 2009/0009175 A1 | 1/2009 | Semati | | |
| 2010/0001715 A1 * | 1/2010 | Doogue et al. | ............. | 324/117 H |

FOREIGN PATENT DOCUMENTS

WO    WO2007091985 A2    8/2007

OTHER PUBLICATIONS

International Search Report and Written Report, International Patent Application PCT/US2009/059498, Mailed Jan. 27, 2010, 11 pages.

(Continued)

*Primary Examiner* — Arleen M Vazquez
(74) *Attorney, Agent, or Firm* — Cantor Colburn LLP

(57) ABSTRACT

A current sensor is provided for non-invasively measuring electrical current in an electrical conductor. The current sensor includes a housing having a Hall effect device and circuitry for transmitting a signal indicative of the current flowing through the electrical conductor. The current sensor includes a base having a surface for supporting an electrical conductor. A magnetic shielding member is coupled to the surface to shield the Hall effect device from stray or external magnetic fields. A compliant member is coupled to the magnetic shielding member opposite the surface. The compliant member compresses to allow the current sensor to accommodate a large variety of electrical conductor sizes. The compliant member further acts to bias the electrical conductor against the Hall effect device.

12 Claims, 6 Drawing Sheets

OTHER PUBLICATIONS

S.Bose "Current Measuring Device" filed Mar. 12, 2009; U.S. Appl. No. 12/402,784; Confirmation No. 8400; First Office Action, Notification Date Oct. 18, 2010 delivered electronically.

S.Bose "Current Measuring Device" filed Mar. 12, 2009; U.S. Appl. No. 12/402,784; Confirmation No. 8400; Second Office Action, Notification Date Nov. 17, 2010 delivered electronically.

S.Bose "Current Measuring Device" U.S. Appl. No. 12/402,784, filed Mar. 12, 2009; Final Office Action Notification Date Apr. 13, 2011.

International Preliminary Report on Patentability for International Application No. PCT/US2009/059498 filed Oct. 5, 2009.

* cited by examiner

CURRENT MEASURING DEVICE

BACKGROUND OF THE INVENTION

The present invention relates generally to a device for the noninvasive measurement of electrical current through a conductor and in particular to a device that may be installed in the field for measuring electrical current with a Hall effect sensor.

Electrical power is typically produced at centralized power production facilities and transferred at high voltages to local substations. The local substations transform the electrical power to a medium or low voltage. The electrical power is subsequently distributed through feeders to local distribution networks. The power is thus delivered to an end customer that consumes the electrical power.

Since the electrical power is often transmitted over long distances, reliability and integrity of the system are major considerations in the design of the transmission system. During transmission of the electrical power, a number of different faults may occur due to events such as vegetation growth and lightening strikes for example. A number of control devices are used within the transmission system such as fuses, transformers, circuit breakers, reclosers and protective relays. These devices help control the flow of electrical power and provide functionality for removing electrical power in the event of an electrical fault.

A protective relay is a type of device that detects undesirable electrical conditions, such as high voltage for example. The protective relay operates in conjunction with a circuit breaker for interrupting the flow of electrical current when the undesired condition is detected. Protective relays have selectable time/current curves that allow the operator to have a fine level of control over the triggering conditions. One type of protective relay uses elaborate electromechanical components, such as but not limited to arrays of induction disks or induction cylinders, shaded-pole magnets, operating and restraint coils, solenoid-type operators, and phase-shifting networks for example, to allow the relay to respond to such conditions as over-current, over-voltage, reverse power flow, over-frequency and under-frequency for example. Protective relays may even be arranged to provide trip functionality for faults up to a certain distance away from a substation but not beyond that point by measuring the apparent impedance.

When a fault occurs, the electromechanical type protective relay provides a signal to the circuit breaker to interrupt the current flow. A mechanical indicator, sometimes referred to as a target flag, is then displayed on the relay to visually indicate the detection of the undesired condition. To restore service, repair personnel need to physically visit the substation where the relays are located and perform an inspection to determine which protective relay operated. Some applications, such as a substation for example, may have many protective relays that cover a wide geographic area. Thus, the process of physically inspecting and identifying the relay may be time consuming and costly.

Accordingly, while existing systems and methods for determining the operation of protective relays are suitable for their intended purposes, there still remains a need for improvements particularly regarding the coupling of sensors with conductors such as those used with electromechanical relays to allow remote detection of electrical characteristics.

SUMMARY OF THE INVENTION

According to one aspect of the invention, a current measuring device is provided having a cover coupled to a base. A magnetic shield member is coupled to the base. A compliant member is coupled to the magnetic shield member. A Hall effect device is coupled to the cover adjacent the magnetic shield member.

According to another aspect of the invention, a current sensor is provided including a housing having a cover and a base. The housing having a first opening on a first side and a second opening on a second side opposite the first opening. The base further having a semi-cylindrical surface extending between the first opening and the second opening. A fastener is couples the cover to the base. A magnetic shielding member is coupled to the semi-cylindrical surface. A compliant member is coupled to the magnetic shielding member. A Hall effect device is coupled to the cover opposite the compliant member. A current sensing circuit is mounted within the housing and electrically coupled to the Hall effect device.

In accordance with another aspect of the invention, a current sensor for measuring electrical current flow through an electrical conductor is provided. The current sensor includes a cover having a substantially planar first surface and a wall extending around the first surface. The cover includes a first semicircular opening in a first side of the cover wall and a second semicircular opening in a second side of the cover wall opposite the first semicircular opening. A base is coupled to the cover, the base having a substantially planar second surface and a wall extending around the second surface, the base wall having a third semicircular opening in a first side of the base wall adjacent the first semicircular opening and a fourth semicircular opening in a second side of the base wall adjacent the second semicircular opening, the base further having a semi-cylindrical surface extending between the third semicircular opening and the fourth semicircular opening. A Hall effect device is coupled to the cover opposite the semi-cylindrical surface. A compliant member is coupled to the semi-cylindrical surface between the semi-cylindrical surface and the Hall effect device. A current sensing circuit is coupled to the cover and electrically coupled to the Hall effect device.

BRIEF DESCRIPTION OF THE DRAWINGS

Referring now to the drawings, which are meant to be exemplary and not limiting, and wherein like elements are numbered alike.

DETAILED DESCRIPTION

Figure 1:
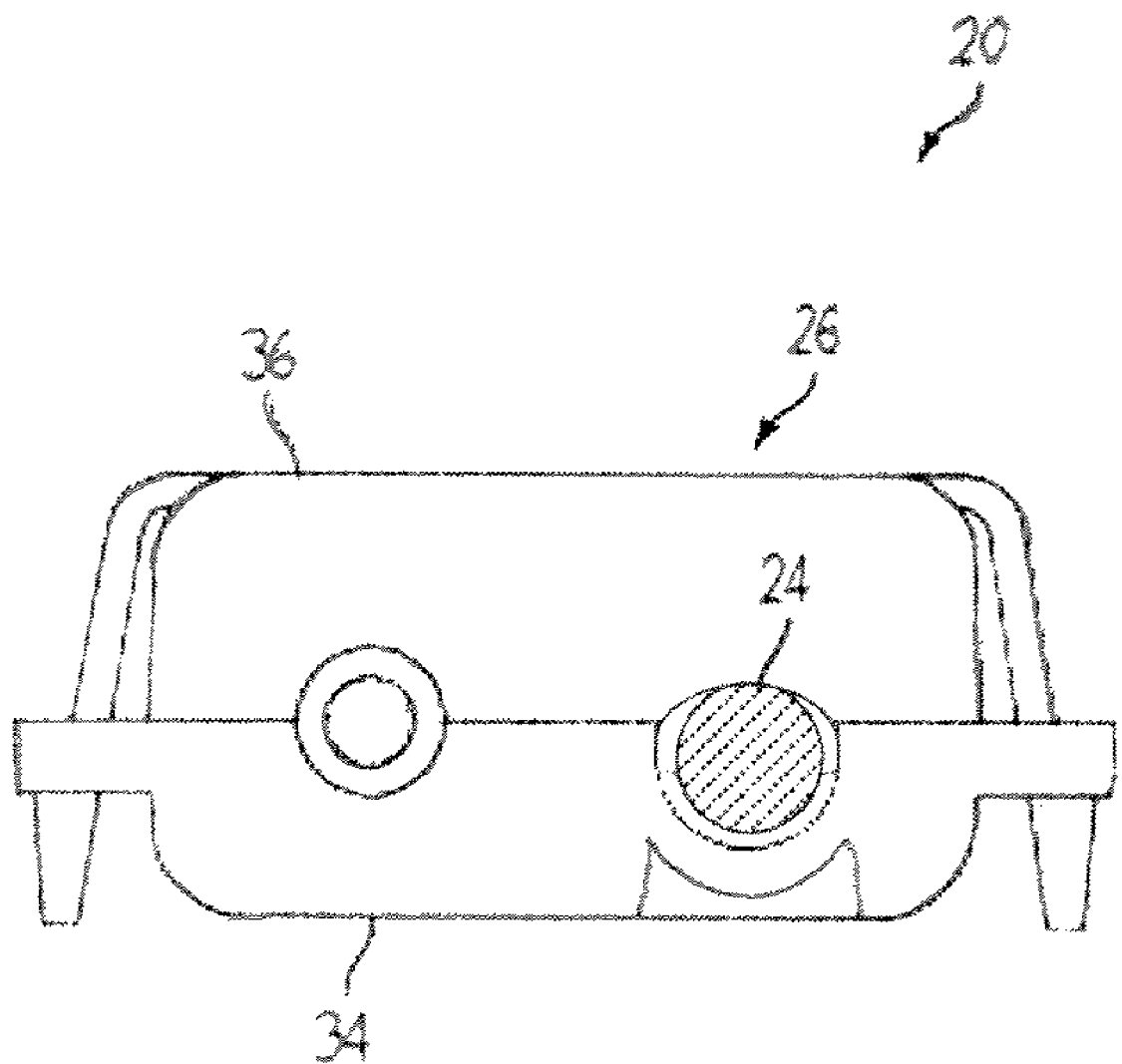
FIG. 1 is a side plan view of a current sensor in accordance with an exemplary embodiment
Figure 2:
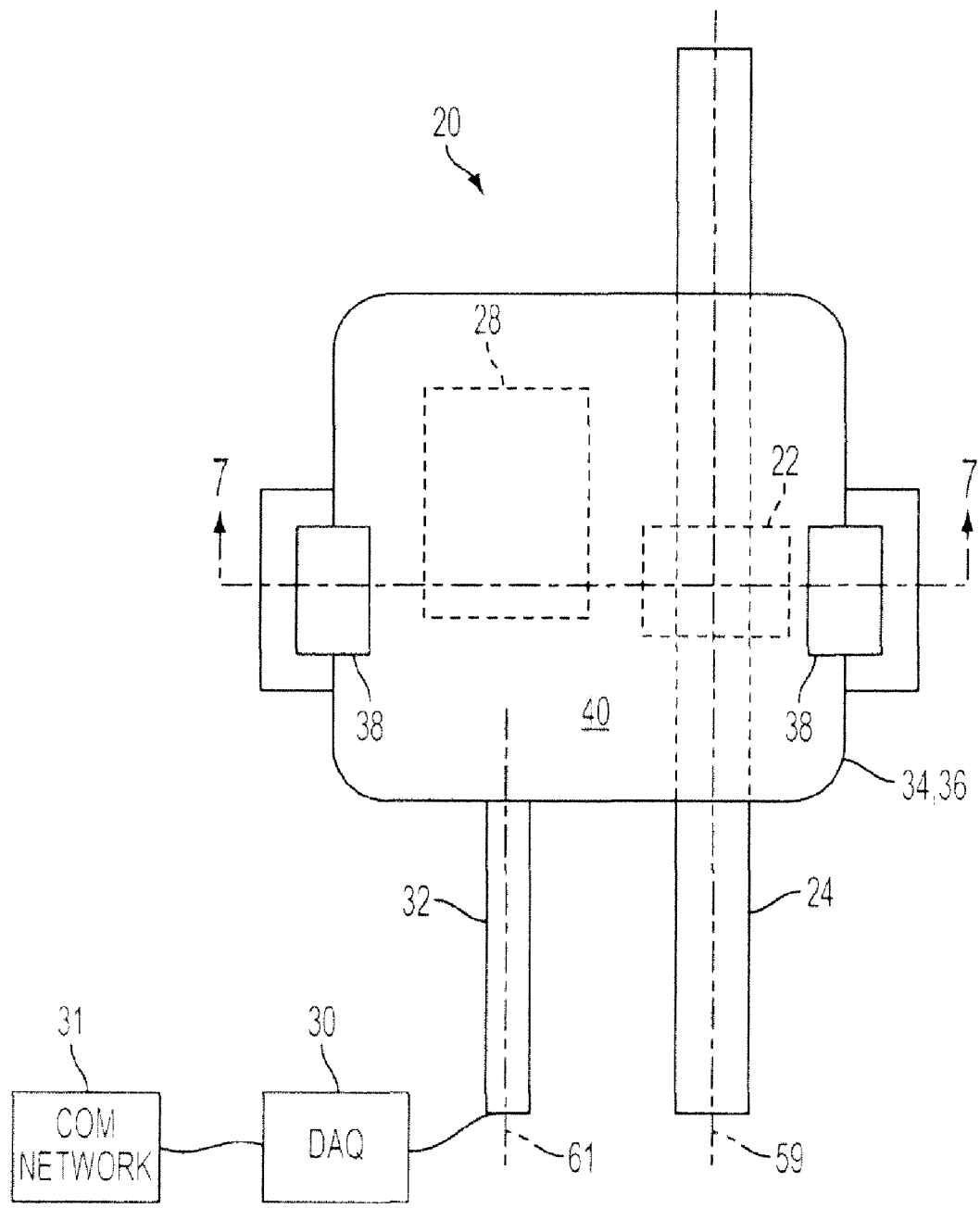
FIG. 2 is a top plan view illustration of the current sensor of FIG. 1.
Figure 3:
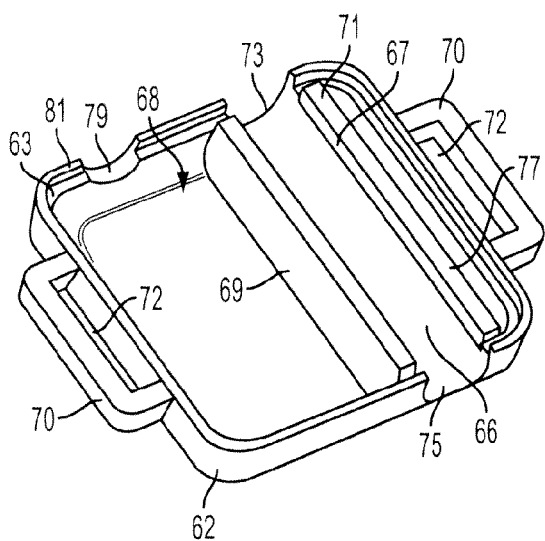
FIG. 3 is a perspective view illustration of a first portion of the current sensor housing for the current sensor of FIG. 1.
Figure 4:
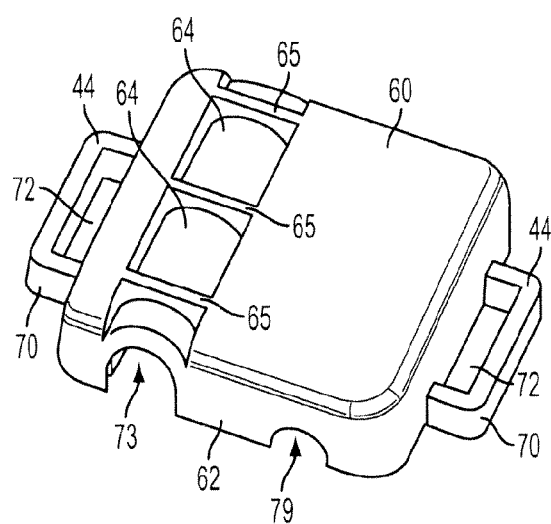
FIG. 4 is another perspective view illustration of the first portion of the current sensor housing of the current sensor of FIG. 1.
Figure 5:
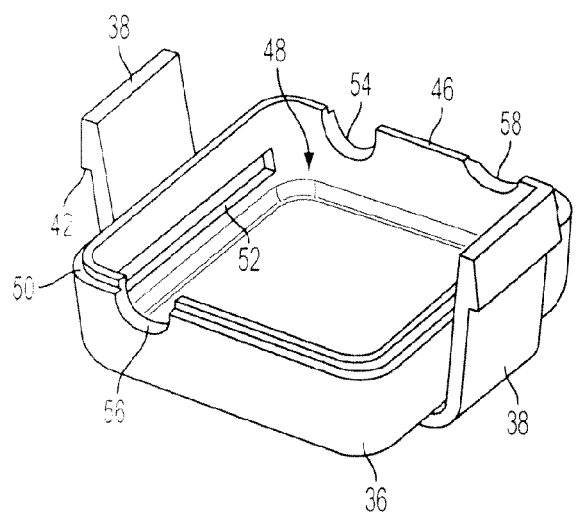
FIG. 5 is a perspective view illustration of a second portion of the current sensor housing of the current sensor of FIG. 1.
Figure 6:
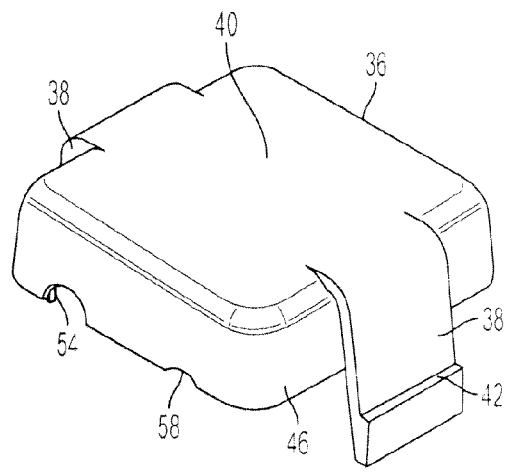
FIG. 6 is another perspective view illustration of the second portion of the current sensor housing of the current sensor of FIG. 1.

FIG. 1-2 illustrates an exemplary embodiment of a current sensor device 20. The current sensor 20 includes a Hall effect device 22 that is placed in contact with an electrical conductor 24 by a clamping force created by the housing assembly 26. In the exemplary embodiment, the Hall effect device 22 is an integrated circuit that includes a transducer that varies its output voltage in response to changes in a magnetic field. When electrical current passes through the electrical conductor 24, a magnetic field is created. In response to the magnetic field, the Hall effect sensor 22 produces an electrical signal that is proportional to the magnetic field and the electrical current flowing through the electrical conductor 24. In a typical application, such as with electrical conductors associated with protective relays for example, Hall effect sensor 22 is capable of sensing a current between 0.2 to 40.0 amps passing through electrical conductor 24.

A current sensing circuit 28 is electrically coupled to receive a signal from the Hall effect sensor 22. It should be appreciated that the sensing circuit 28 may be integrated as a single package with the integrated circuit of the Hall effect sensor 22. The sensing circuit 28 may also include signal-conditioning circuitry that modifies a signal indicative of the current flowing through electrical conduit 24, such as through amplification for example. These modifications prepare the signal for transmission to a data acquisition system 30. In the exemplary embodiment, the signal is transmitted between the sensing circuit 28 and the data acquisition system 30 over a data transmission medium 32 that carries both power and data. Alternatively, the electrical power needed for operation of the current sensor 20 may be supplied via a separate conductor either from the data acquisition system 30 or from a separate power supply (not shown). Data transmission media 32 includes, but is not limited to, twisted pair wiring, multi-core wiring, coaxial cable, and fiber optic cable. Data transmission media 32 also includes, but is not limited to, wireless, radio and infrared signal transmission systems.

The data acquisition system 30 may be a dedicated acquisition system, or alternatively may be a general-purpose computer having executable software for receiving signals from the current sensor 20. As such, the data acquisition system 30 may be microprocessor, microcomputer, a minicomputer, an optical computer, a board computer, a complex instruction set computer, an ASIC (application specific integrated circuit), a reduced instruction set computer, an analog computer, a digital computer, a molecular computer, a quantum computer, a cellular computer, a superconducting computer, a supercomputer, a solid-state computer, a single-board computer, a buffered computer, a computer network, a desktop computer, a laptop computer, or a hybrid of any of the foregoing.

The data acquisition system 30 may optionally be coupled to a communications network 31. The communications network 31 may be any type of known network including, but not limited to, a wide area network (WAN), a public switched telephone network (PSTN), a local area network (LAN), a global network (e.g. Internet), a virtual private network (VPN), and an intranet. The communications network 31 may be implemented using a wireless network or any kind of physical network implementation known in the art. The data acquisition system 30 may be coupled to one or more computer servers (not shown) or other data acquisition systems (not shown) through multiple networks (e.g., intranet and Internet).

The data acquisition system 30 depicted in FIG. 2 may be implemented using one or more servers operating in response to a computer program stored in a storage medium accessible by the data acquisition system 30. The data acquisition system 30 may operate as a network server (e.g., a web server) to receive signals from one or more current sensors 20. The data acquisition system 30 handles receiving signals from the current sensors 20 and can perform associated tasks such as analyzing and aggregating data for example. The data acquisition system 30 may also include firewalls to prevent unauthorized access and enforce any limitations on authorized access. For instance, an administrator may have access to the entire system and have authority to modify portions of the system. A firewall may be implemented using conventional hardware and/or software as is known in the art.

Data acquisition system 30 is capable of converting the analog voltage or current level provided by current sensor 20 into a digital signal indicative of the level of the amount of electrical power flowing through conductor 24. Alternatively, current sensor 20 may be configured to provide a digital signal to data acquisition system 30, or an analog-to-digital (A/D) converter (not shown) maybe coupled between current sensor 20 and data acquisition system 30 to convert the analog signal provided by current sensor 20 into a digital signal for processing by data acquisition system 30. It should be further appreciated that additional components and circuits (not shown), such as routers and network switches for example, may be arranged between the current sensor 20 and the data acquisition system 30 without deviating from the intended scope of the claimed invention.

Referring now to FIGS. 1-6, the housing assembly 26 will be described. The current sensor 20 includes a housing assembly 26 with a base 34 and a cover 36. In the exemplary embodiment, the cover 36 couples to the base 34 by a snap fit connection. The snap fit assembly provides advantages in allowing the current sensor to be easily, but securely, installed on conductors in the field. In the exemplary embodiment, the snap fit is created by a pair of arms 38 that extend from a top planar surface 40 of the cover 36. The arms include a tab portion 42 that engages a surface 44 on the base 34 to retain the cover 36 to the base 34 when the cover 36 is assembled onto the base 34. It should be appreciated that the cover 36 may also be coupled to the base 34 by other methods known in the art, such as mechanical fasteners, screws, or bonded with an adhesive for example. Further, in an alternate embodiment, the cover 36 and base 34 are joined on one side with a hinge (not shown) on one side and a snap fit or other fastener on an opposite side.

A wall 46 extends from the periphery of the top planar surface 40 to form a generally hollow interior 48. A lip 50 may be formed on the end of the wall 46 opposite the top planar surface 40 to aid in assembly of the cover onto the base 34 and increase the stability of the assembly 26. The wall 46 may also include a recess 52 formed adjacent the interior portion 48. As will be discussed below, the recess 52 is sized to receive a printed circuit board and retain the printed circuit board in the cover 36. In one embodiment, the printed circuit board 74 (FIG. 7) is retained without use of adhesives or other external fasteners. In the exemplary embodiment, two recesses 52 are formed in the wall 46 opposite each other to capture the printed circuit board 74. Finally, the cover 36 includes a plurality of semicircular openings 54, 56, 58. As will be discussed in more detail below, the semicircular openings 54, 56, 58 cooperate with openings in the base 34 to allow the electrical conductor 24 and data transmission medium 32 to exit the housing assembly 26. Further, in the exemplary embodiment, the centerline 59 of the semicircular openings 54, 56 is substantially parallel to the centerline 61 of semicircular opening 58. This arrangement provides advantages in maintaining the data transmission media 32 substantially parallel to the electrical conductor 24, which helps prevent the inadvertent decoupling of the sensor 20 due to external forces. In the exemplary embodiment, the cover 36 is formed from a nonconductive plastic material such as polypropylene, polyethylene or polycarbonate for example.

Similar to the cover 36, the base 34 has a bottom surface 60 with a wall 62 extending about the periphery to form an interior area 68. The wall 62 includes a lip 63 that cooperates with the lip 50 in the cover when the current sensor 20 is assembled. In the exemplary embodiment, the bottom surface 60 is substantially planar. The bottom surface may also include one or more recesses or cores 64 that allow the base 34 to be injection molded with a semi-cylindrical surface 66 positioned within the interior portion 68. The bottom surface 60 may further include ribs 65 that strengthen and increase the structural integrity of the base 34 and separate the cores 64. In the exemplary embodiment, pair of u-shaped protrusions 70 extend from the wall 60. The protrusions 70 form openings 72 that are sized to receive the arm 38 from the cover 36. The surface 44 is located on one side of the protrusions 70. As discussed above, the surface 44 cooperates with the tab portion 42 of the arm 38 to securely fasten the base 34 and cover 36 together.

Opposite the bottom surface 60 is the generally hollow interior area 68. When the base 34 and cover 36 are assembled, the interior area 68 and the hollow interior 48 cooperate to form a space sized to contain the printed circuit board 74 and the current sensing circuit 28. Adjacent the hollow area 68 is the surface 66, which is formed between a first wall 69 and a second wall 71. The surface 66 is semi cylindrical and extends between a first semicircular opening 73 and a second semicircular opening 75. The openings 73, 75 in the base 34 cooperate with the openings 54, 56 in the cover 36 to form circular openings that are sized to receive the electrical conductor 24. Similarly, the openings 58, 79 in the cover 36 and base 34 respectively, also cooperate to provide an opening for the data transmission medium 32 to exit the current sensor 20.

Figure 7:
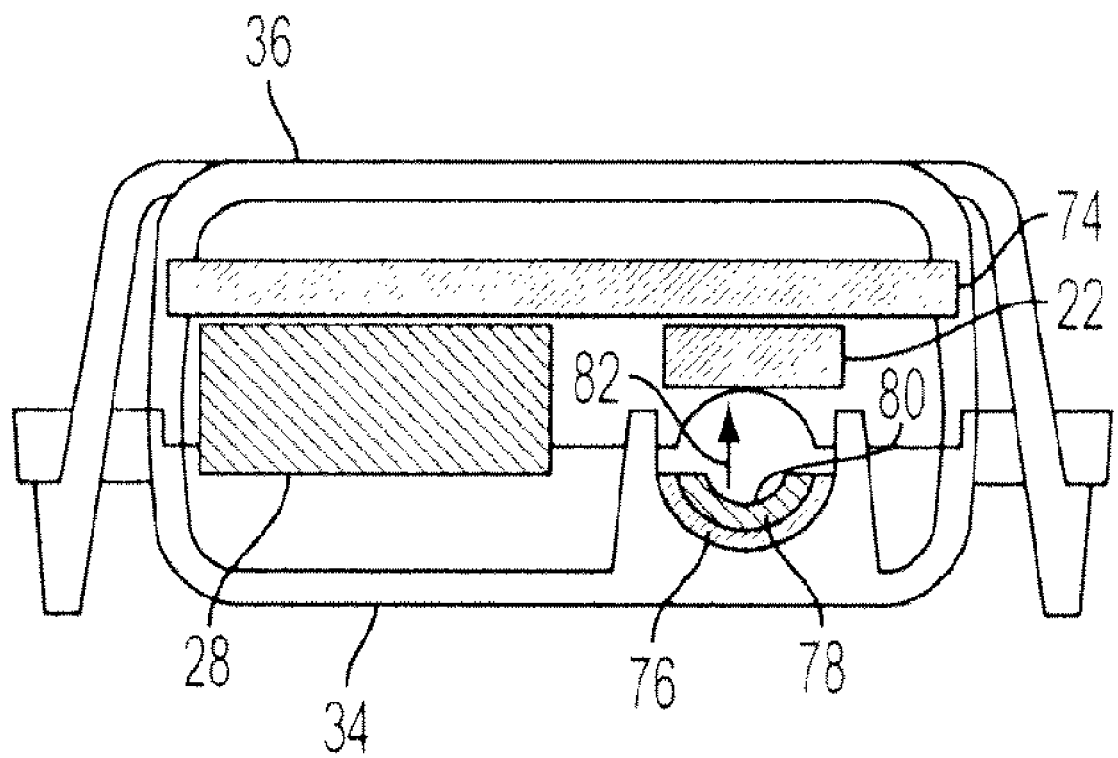
FIG. 7 is a side plan sectional view illustration of the current sensor of FIG. 1; and, FIG. 8 is a top plan view illustration of another embodiment current sensor having wireless connectivity.

The surface 66 provides support for components such as a mu-metal member 76 (FIG. 7) and compliant member 78 (FIG. 7). Since the surface 66 extends the width of the current sensor 20, the electrical conductor 24 is captured between the surface 66, the openings 54, 56 in the cover 36 and the Hall effect device 22. It should be appreciated that having three points of contact between the electrical conductor 24 and the cover 36 provides a more secure coupling of the electrical conductor 24 to the current sensor 20. The security of the coupling increases as the width of the current sensor increases. In one embodiment, the width of the current sensor 20 (or the distance between the openings 54, 56) is four times the diameter of the openings 54, 56. It should be appreciated that increasing the security of the coupling provides advantages in preventing the sensor 20 from being knocked loose, or moved during operation. The additional support also provides advantages in maintaining the orientation of the electrical conductor 24 relative to the Hall effect device 22. By maintaining the orientation of the electrical conductor 24, the orientation of the magnetic field generated by the electrical conductor 24 also stays the same, which provides, advantages in the consistency of the current measurements.

In the exemplary embodiment, the surface 66 includes a planar portion 67 that extends from the semicircular portion. The planar portion ends at a top surface 77 that lies substantially in plane with the top surface 81 of the lip 63. It should be appreciated that while the openings 54, 56, 73, 75 and surface 66 are described herein as being circular and cylindrical respectively, other shapes may be used to support and securely hold the electrical conductor 24. For example, as discussed in more detail below, a compliant member 78 is allowed to compress to accommodate different size electrical conductors. Therefore, in some applications, it may be desirable to provide a different shape surface 66, such as a semi-elliptical surface for example, to provide space to allow the compliant member to compress.

In the exemplary embodiment, the base 34 is formed from a nonconductive plastic material such as polypropylene, polyethylene or polycarbonate for example.

Referring now to FIG. 7, the sensor 20 also includes a magnetic shielding member 76 coupled to the surface 66. In the exemplary embodiment, the magnetic shielding member 76 is made from a mu-metal material. The magnetic shielding member 76 is a thin walled member that extends the width of the base 34. In the exemplary embodiment, the magnetic shielding member 76 is adhesively bonded to the surface 66. Alternative coupling methods, such as insert molding for example, may also be used. A mu-metal is typically a nickel-iron alloy (75% nickel, 15% iron, plus copper and molybdenum) that has very high magnetic permeability. As will be discussed in more detail below, the high permeability makes the magnetic shielding member 76 effective as a shield to screen static or low frequency magnetic fields. Other high magnetic permeability materials, such as supermalloy, nilomag, sanbold, or Molybdenum Permallo for example, may also be used in place of mu-metal. It should be appreciated that while the magnetic shielding member 76 is illustrated as being semi-cylindrical, the magnetic shielding member 76 may also extend to conform substantially to the cylindrical surface 66 and the planar portion 67. A larger magnetic shielding member 76 may be desirable in applications having a large amount of external magnetic fields for example. Further, in some embodiments, the surface 66 may be eliminated and the magnetic shielding member 76 is coupled to the base 34.

Coupled to the magnetic shielding member 76 opposite the surface 66 is a compliant member 78. In the exemplary embodiment, the compliant member 78 extends the width of the base 34 between the openings 54, 56. As discussed above, by having the compliant member 78 extend the width of the base 34, the coupling of the current sensor 20 to the electrical conductor 24 and accuracy of current measurements is improved. The larger support width further provides advantages in stability and in keeping the electrical conductor 24 correctly oriented with the Hall effect device 22 during operation. It should be appreciated that it is desirable to have the current sensor 20 accommodate a wide range of electrical conductor sizes. Since the compliant member 78 may be compressed, this allows the use of a single sensor 20 to be utilized with a wide variety of electrical conductor 24 wire diameters.

In the exemplary embodiment, the compliant member 78 has an inner surface 80 that is sized to receive the smallest diameter electrical conductor that the sensor 20 is expected to receive in a given application. In other embodiments, the compliant member 78 may be removably attached to the magnetic shielding member 76. In these embodiments, the installer may interchange the compliant member 78 with a different compliant member that it sized for the desired electrical conductor. In the exemplary embodiment, the compliant member 78 is made from a material with sufficient elasticity to allow the compliant member 78 to compress to also receive the largest diameter electrical conductor 24 the sensor 20 is expected to receive. In the exemplary embodiment, the compliant member 78 is further made from a structural foam material, such as open cell urethane foam for example. Alternatively, the compliant member 78 may also be an elastomer material.

The compliant member 78 and the magnetic shielding member 76 are arranged opposite the Hall effect device 22. Due to the compression of the compliant member 78 by the electrical conductor 24, the compliant member 78 biases the electrical conductor 24 in the direction indicated by arrow 82. As such, the compliant member 78 also acts to keep the electrical conductor 24 securely against the Hall effect device 22 during operation with a wide variety of wire diameters. In some embodiments, the diameter of the inner surface 80 is slightly smaller than the diameter of the smallest expected electrical conductor, such that even the smallest electrical conductor will be biased against the Hall effect device 22.

In one embodiment, the current sensor 20 is used in an electrical distribution facility, such as a substation for example. In this type of application, the current sensor 20 may need to be coupled with a wide variety of electrical conductor sizes. For example, a typical substation may have a range of electrical conductor sizes, such as from an 8 gauge, as defined by the American Wire Gauge (AWG) scale, to a 14 gauge for example. Thus, in this example, the compliant member 78 would have an inner diameter of 0.064 inches (14 gauge), and would compress to accept an electrical conductor with a diameter of 0.128 inches (8 gauge). It should be appreciated that the compliant member 78 may be made from any material that has the desired elasticity properties and also does not substantially affect the magnetic field generated by the electrical conductor 24.

It should be appreciated that other embodiments of compliant member 78 may also be used. For example, it is contemplated that compliant member 78 may be a spring, or a series of springs that bias the electrical conductor 24. These springs (not shown) may be positioned either above, or below the magnetic shielding member 76. Alternatively, the Hall effect device 22 may be mounted to a compliant member, such as a spring or a grommet (not shown) for example, that biases the Hall effect device 76 into contact with the electrical conductor 24.

During operation, the sensor 20 is first installed on an electrical conductor 24, such as an electrical conductor that connects a protective relay to a current transformer for example. To install the sensor 20, the operator places the desired electrical conductor 24 into the base 34 and against the compliant member 78 inner surface 80. The cover 36 is arranged over the base 34 with the arms 38 aligned with the openings 72. The operator then inserts the arms 38 into the openings 72 causing the arms 38 to deflect. This continues until the tab portion 42 extends past the surface 44 of the protrusions 70. Once the tab portion 42 engages the surface 44, the compliant member 78 holds the electrical conductor 24 against the Hall effect device 22. The arms 38 and tab portion 42 are sized such that the lip portions 50, 63 of the base 34 and cover 36 respectively, are engaged when the tab portion 42 engages the surface 44. It should be appreciated that the clamping force created by the biasing member 78 is of sufficient level to maintain the current sensor 20 in the desired position during operation.

With the current sensor 20 coupled to the electrical conductor 24, the Hall effect device 22 is positioned within the influence of magnetic fields generated by electrical current flowing through the electrical conductor 24. Since the magnetic shielding member 76 substantially surrounds the conductor 24 in the area opposite the Hall effect device 22, any magnetic field detected by the Hall effect device 22 should be from the electrical conductor 24 and not due to magnetic fields from surrounding or adjacent conductors or other electrical devices. Therefore, once electrical current flows through electrical conductor 24, Hall effect device 22 will generate a signal that is then processed by current sensing circuit 28 before being transmitted by transmission media 32.

Figure 8:
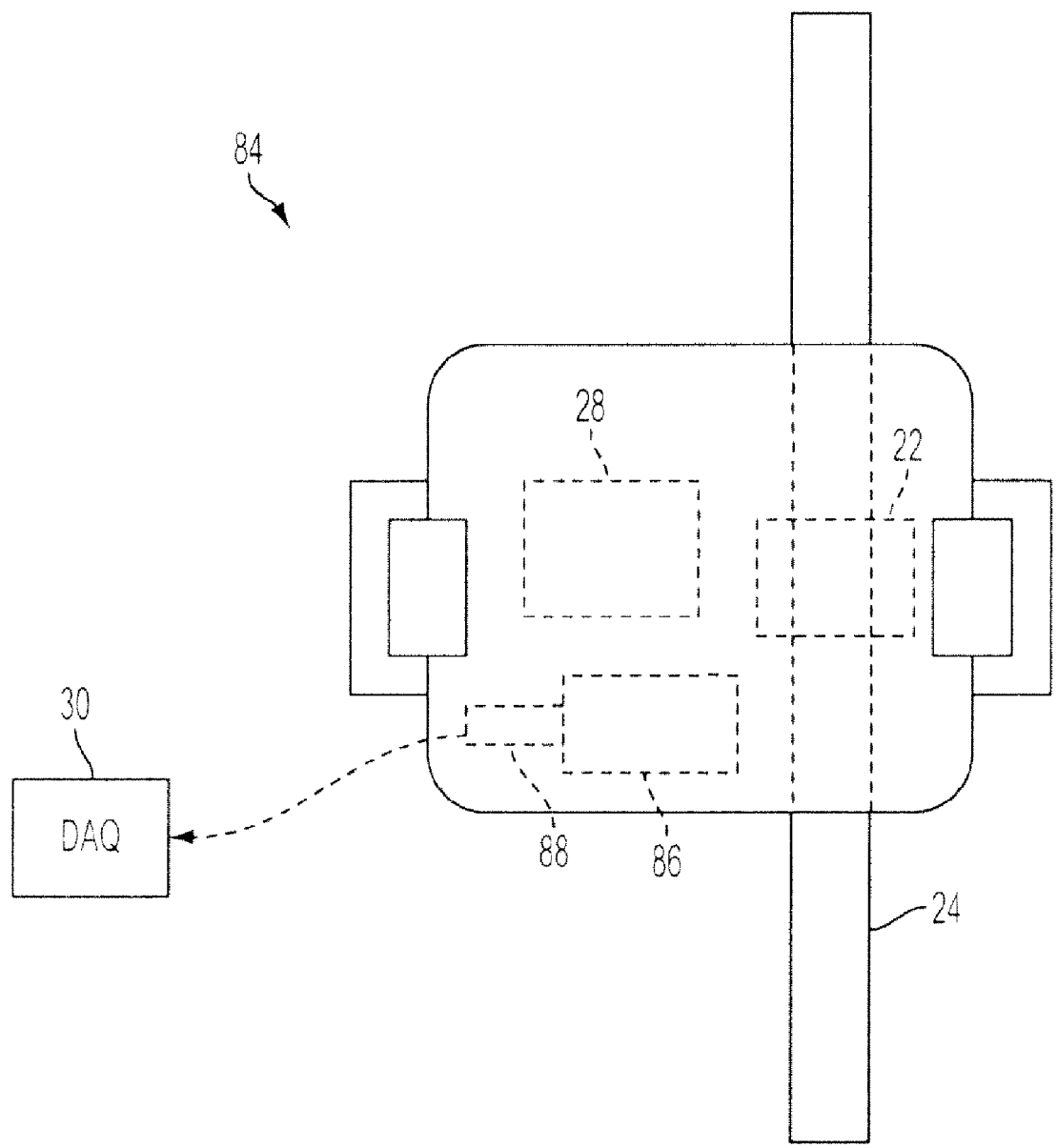

Another embodiment current sensor 84 is illustrated in FIG. 8. This embodiment is similar to that described above with respect to FIGS. 1-7. In this embodiment, an additional communications circuit 86 is coupled to the output of current sensing circuit 28. The communications circuit 86 includes an antenna 88. The antenna 88 transmits the signal wirelessly with electromagnetic radiation to data acquisition system 30. As such, communications circuit 86 may transmit the signal using cellular, GSM, radio, infrared light, laser light or acoustic energy. The communications circuit 86 may further comply with a variety of standards including but not limited to IEEE 802.11, IEEE 802.16, bluetooth, wireless universal serial bus, dedicated short range communications (DSRC), air-interface, long and medium range (CALM). The communications circuit 86 may also transmit signals via a personal area network, such as a wireless mesh network defined by IEEE 802.15.4 protocol for example. The wireless mesh network provides a low cost, low speed communications network between devices, such as current sensor 20 for example, that are located in a proximate, though not necessarily close, to each other. Under the IEEE 802.15.4 protocol, the devices are generally within 10 meters of a coordinating device, such as data acquisition system 30 for example.

It should be appreciated that the antenna 88 may be integrated with the communications circuit 86 internal to the base 34 and cover 36 assembly, or alternatively be positioned externally to the current sensor 84. The use of a wireless connection provides an advantage in facilitating the installation of the current sensor 84 in equipment cabinets, such as where protective relays are located for example. This avoids the need to route cables or drill pass-through openings to allow the cable to exit the cabinet.

Electrical power for operating the wireless current sensor 84 may be provided by a self-powering current sensor. A self-powering current sensor, such as a current transformer for example, generates electricity in proportion to electrical current flowing through its windings. Alternatively, the electrical power may be provided by a power source such as a battery for example.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A current sensor comprising:
 a housing made from a nonconductive plastic material, said housing having a cover and a base, said housing having a first opening on a first side and a second opening on a second side opposite said first opening, said base further having a semi-cylindrical surface extending between said first opening and said second opening, said cover having a hollow interior area defined by a wall extending about a periphery of said cover, said wall having an opposing first slot and second slot;
 a fastener coupling said cover to said base;
 a magnetic shielding member coupled to said semi-cylindrical surface;
 a compliant member coupled to said magnetic shielding member;

a Hall effect device coupled to said cover and disposed within said interior area opposite said compliant member; and, a current sensing circuit mounted within said cover by said first slot and said second slot, said current sensing circuit being electrically coupled to said Hall effect device.

2. The current sensor of claim 1 wherein said fastener is an arm formed in said cover that cooperates with a third opening formed in said base.

3. The current sensor of claim 1 wherein:
said housing has a width;
said first opening and said second opening, have a first diameter; and,
said width is at least four times said first diameter.

4. The current sensor of claim 1 further comprising a communications circuit electrically coupled to said current sensing circuit.

5. The current sensor of claim 4 further comprising an antenna coupled to said communications circuit.

6. The current sensor of claim 1 further comprising:
a fourth opening in said housing first side; and,
a data transmission medium electrically coupled to said current sensing circuit and exits said housing through said fourth opening.

7. The current sensor of claim 6 wherein said compliant member is made from a compressible foam.

8. A current sensor for measuring electrical current flow through an electrical conductor, said current sensor comprising:

a cover having a substantially planar first surface and a wall extending around said first surface, said cover having a first semicircular opening in a first side of said cover wall and a second semicircular opening in a second side of said cover wall opposite said first semicircular opening, said cover having a first arm extending from a third side and a second arm extending from an opposing fourth side, said cover wall defining a hollow interior area having a first slot in said third side and a second slot in said fourth side, said cover being made from a nonconductive plastic material;

a base having a substantially planar second surface and a wall extending around said second surface, said base wall having a third semicircular opening in a first side of said base wall adjacent said first semicircular opening and a fourth semicircular opening in a second side of said base wall adjacent said second semicircular opening, said base further having a semi-cylindrical surface extending between said third semicircular opening and said fourth semicircular opening, said base wall having a first protrusion extending from a third side of said base wall and a second protrusion extending from a fourth side of said base wall, said first protrusion and said second protrusion cooperating with said first arm and said second arm to removably couple said base to said cover, said base being made from a nonconductive plastic material;

a Hall effect device coupled to said cover within said interior area opposite said semi-cylindrical surface;

a compliant member coupled to said semi-cylindrical surface between said semi-cylindrical surface and said Hall effect device; and, a current sensing circuit coupled to said cover by said first slot and said second slot, said current sensing circuit being electrically coupled to said Hall effect device.

9. The current sensor of claim 8 further comprising a magnetic shield member coupled to said semi-cylindrical surface between said semi-cylindrical surface and said compliant member.

10. The current sensor of claim 9 wherein said first semicircular opening and said third semicircular opening cooperate to form a second opening sized to receive said electrical conductor.

11. The current sensor of claim 10 wherein a width of said base is sized to be at least 4 times a diameter of said second opening.

12. The current sensor of claim 11 wherein compliant member is made from a compressible foam material.

* * * * *